(12) United States Patent
Kwak (10) Patent No.: US 8,865,573 B2
(45) Date of Patent: Oct. 21, 2014

(54) METHOD FOR FABRICATING SEMICONDUCTOR DEVICE

(71) Applicant: SK Hynix Inc., Gyeonggi-do (KR)

(72) Inventor: Byung-Il Kwak, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/720,005

(22) Filed: Dec. 19, 2012

(65) Prior Publication Data
US 2014/0024201 A1    Jan. 23, 2014

(30) Foreign Application Priority Data

Jul. 17, 2012 (KR) .................. 10-2012-0077790

(51) Int. Cl.
*H01L 21/322* (2006.01)
*H01L 21/28* (2006.01)
*H01L 21/30* (2006.01)

(52) U.S. Cl.
CPC ........ *H01L 21/322* (2013.01); *H01L 21/28176* (2013.01); *H01L 21/3003* (2013.01); *H01L 21/28202* (2013.01)
USPC .......................................... 438/474; 438/476

(58) Field of Classification Search
None
See application file for complete search history.

(56) References Cited

U.S. PATENT DOCUMENTS

| 6,165,873 A | 12/2000 | Hamada |
| 6,521,977 B1 | 2/2003 | Burnham et al. |
| 2010/0193914 A1* | 8/2010 | Nakamura .................... 257/618 |

FOREIGN PATENT DOCUMENTS

KR    19960010338    7/1994

* cited by examiner

*Primary Examiner* — Zandra Smith
*Assistant Examiner* — Pamela E Perkins
(74) *Attorney, Agent, or Firm* — IP & T Group LLP (57) ABSTRACT

A method for fabricating a semiconductor device include forming devices on a front side of a semiconductor substrate, forming a hydrogen-containing layer on a back side of the semiconductor substrate, forming an outgassing prevention layer over the hydrogen-containing layer, and performing a hydrogen treatment process to diffuse hydrogen, contained in the hydrogen-containing layer, into the semiconductor substrate.

19 Claims, 6 Drawing Sheets

METHOD FOR FABRICATING SEMICONDUCTOR DEVICE

CROSS-REFERENCE TO RELATED APPLICATIONS

The present application claims priority of Korean Patent Application No. 10-2012-0077790, filed on Jul. 17, 2012, which is incorporated herein by reference in its entirety.

BACKGROUND

1. Field

Exemplary embodiments of the present invention relate to a method for fabricating a semiconductor device, and more particularly, to a hydrogen treatment method for improving refresh characteristics.

2. Description of the Related Art

With high integration of semiconductor devices, it has been difficult to secure a refresh time of a dynamic random-access memory (DRAM) cell transistor. In order to secure a refresh time, hydrogen treatment is performed on a semiconductor substrate. The hydrogen treatment is performed to improve an electric connection characteristic between metal interconnections or between the semiconductor substrate and metal interconnections, enhance the characteristic and reliability of a semiconductor device, and increase productivity during a fabrication process.

In the case of a DRAM, an interface state, formed by a dangling bond of silicon, may exist between a silicon oxide layer (for example, isolation layer or gate dielectric layer) and a semiconductor substrate. Through the interface state, a leakage current may flow from a diffusion layer to the substrate, thereby degrading a hold characteristic of DRAM. Furthermore, a transistor characteristic such as a threshold voltage or current voltage characteristic may vary, thereby making it difficult to fabricate a reliable semiconductor device.

The hydrogen treatment supplies hydrogen to the interface, and the supplied hydrogen eliminates the dangling bond, thereby reducing the interface state. However, with the continuous integration and high density of semiconductor devices, it is becoming difficult to sufficiently diffuse hydrogen to a target interface through the hydrogen treatment. Therefore, it becomes necessary to perform the hydrogen treatment at a higher temperature or for a longer processing time.

However, if the processing time is lengthened, productivity may decrease. Furthermore, when the hydrogen treatment is performed at an excessively high temperature, spikes or hillocks may be formed on metal interconnections, thereby reducing the reliability of the DRAM.

During the hydrogen treatment, a hydrogen diffusion path is formed from an edge of a wafer. This is because a nitride layer, having low diffusivity of hydrogen, is formed on portions of the wafer. In particular, a silicon nitride layer is very densely formed by a low pressure chemical vapor deposition (LPCVD method, and may be used as a diffusion barrier for hydrogen.

Because of a nitride layer formed on a front side of the wafer, permeation and diffusion of hydrogen are not directly performed, but rather, are performed from the edge of the wafer, where the nitride layer is not formed. Accordingly, since hydrogen passivation is not sufficiently performed toward the center of the wafer, the refresh time may be degraded.

Such a problem is discovered in all processes, and becomes more serious under a situation in which it becomes difficult to secure the refresh time, with the miniaturization of devices.

SUMMARY

An embodiment of the present invention is directed to a method for fabricating a semiconductor device, which is capable of smoothly performing hydrogen passivation regardless of positions.

In accordance with an embodiment of the present invention, a method for fabricating a semiconductor device includes forming devices on a front side of a semiconductor substrate, forming a hydrogen-containing layer on a back side of the semiconductor substrate, forming an outgassing prevention layer over the hydrogen-containing layer, and diffusing hydrogen contained in the hydrogen-containing layer into the semiconductor substrate.

In accordance with another embodiment of the present invention, a method for fabricating a semiconductor device includes forming devices on a front side of the semiconductor substrate, forming vias by selectively etching a back side of the semiconductor substrate, and performing a hydrogen treatment process on the semiconductor substrate through the vias to diffuse hydrogen into the semiconductor substrate.

In accordance with yet another embodiment of the present invention, a method for fabricating a semiconductor device includes forming devices on a front side of the semiconductor substrate, forming vias by selectively etching a back side of the semiconductor substrate, forming a hydrogen-containing layer to fill the vias, forming an outgassing prevention layer over the hydrogen-containing layer, and diffusing hydrogen contained in the hydrogen-containing layer into the semiconductor substrate.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1A:
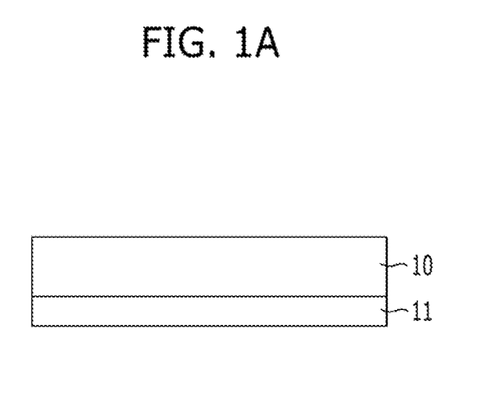
FIGS. 1A and 1B are cross-sectional views illustrating a hydrogen treatment method in accordance with a first embodiment of the present invention.
Figure 1B:
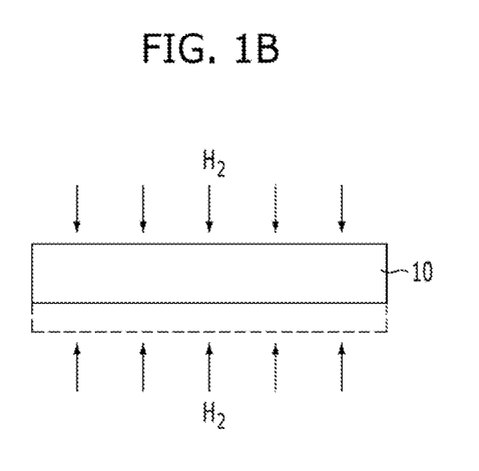

FIGS. 1A and 1B are cross-sectional views illustrating a hydrogen treatment method in accordance with a first embodiment of the present invention.

Referring to FIG. 1A, devices (not shown) are formed on a front side of a semiconductor substrate 10, and a front passivation layer (not shown) is deposited at the uppermost layer thereof. Furthermore, one or more passivation layers 11, including a nitride layer, are formed on a back side of the semiconductor substrate 10. Accordingly, it becomes difficult to diffuse hydrogen through the back side of the semiconductor substrate 10 during hydrogen treatment.

Referring to FIG. 1B, the one or more passivation layers 11 including the nitride layer formed on the backside of the semiconductor substrate 10 are removed, and hydrogen treatment is then performed under a hydrogen atmosphere. At this time, a process for partially reducing the thickness of the semiconductor substrate 10 may additionally be performed. The semiconductor substrate 10 may be etched through a wet etching or polishing process. During the etching process, the thickness of the semiconductor substrate 10 may be reduced until the thickness of semiconductor substrate 10 is greater than a thickness at which the semiconductor substrate will bend.

The hydrogen treatment may include an annealing process such as a deuterium/nitrogen ($D_2/N_2$) annealing process, or high pressure hydrogen/nitrogen ($H_2/N_2$) annealing process, or a hydrogen ion implantation process through the back side of the semiconductor substrate 10.

Since the one or more passivation layers 11 formed on the back side of the semiconductor substrate 10 are removed, and the semiconductor substrate 10 is additionally etched to a predetermined thickness, the permeation path or diffusion path of hydrogen is formed through the back side of the substrate during the hydrogen treatment. Thus, regardless of whether or not nitride layer exists over the semiconductor substrate 10, hydrogen may be uniformly diffused across the entire surface of the wafer. Therefore, a dangling bond of silicon may be eliminated, thereby reducing an interface state. Therefore, a refresh time may be secured to improve a refresh margin of a cell transistor.

FIGS. 2A to 2D are cross-sectional views illustrating a hydrogen treatment method in accordance with a second embodiment of the present invention.

Figure 2A:
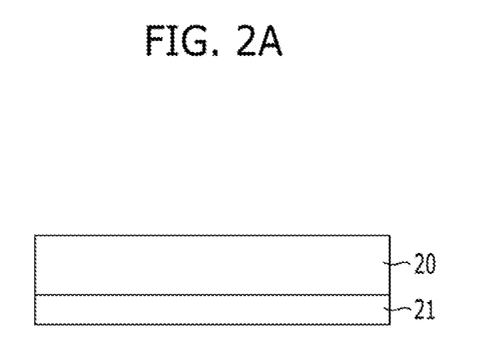
FIGS. 2A to 2D are cross-sectional views illustrating a hydrogen treatment method in accordance with a second embodiment of the present invention.

Referring to FIG. 2A, devices (not shown) are formed on a front side of a semiconductor substrate 20, and a front passivation layer (not shown) is deposited at the uppermost layer thereof. Furthermore, one or more passivation layers 21, including a nitride layer, are formed on a backside of a semiconductor substrate 20. Accordingly, it becomes difficult to diffuse hydrogen through the back side of the semiconductor substrate 20 during hydrogen treatment.

Figure 2B:
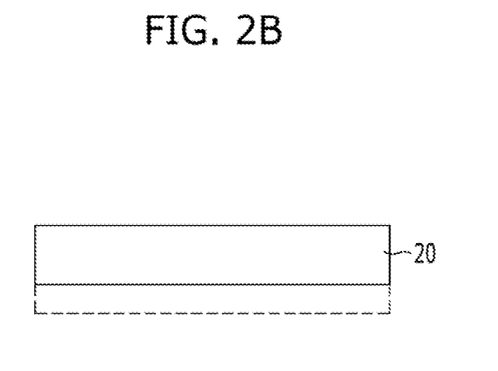

Therefore, referring to FIG. 26, the one or more passivation layers 21 including the nitride layer formed on the back side of the semiconductor substrate 20 are removed. At this time, a process for partially reducing the thickness of the semiconductor substrate 20 may additionally be performed. The semiconductor substrate 20 may be etched through a wet etching or polishing process. During the etching process, the thickness of the semiconductor substrate 20 may be reduced until the thickness of semiconductor substrate 10 is greater than a thickness at which the semiconductor substrate will bend.

Figure 2C:
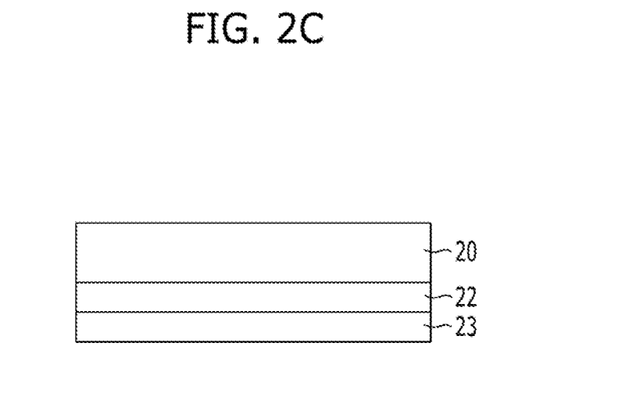

Referring to FIG. 2C, a hydrogen containing layer 22 is formed. The hydrogen containing layer 22 may include an oxide layer containing a large amount of hydrogen. For example, the hydrogen containing layer 22 may include a high density plasma (HDP) oxide layer or a tetraethyl orthosilicate (TEOS) layer.

Then, an outgassing prevention layer 23 may be formed. The outgassing prevention layer 23 may prevent hydrogen from being diffused from the hydrogen containing layer 22, and away from the semiconductor substrate 20, during a subsequent annealing process. The outgassing prevention layer 23 may be formed of the same material as the one or more passivation layers 21. The outgassing prevention layer 23 may include a nitride layer. For example, the nitride layer may include a plasma enhanced (PE) nitride layer.

At this time, the hydrogen containing layer 22 and the outgassing prevention layer 23 are formed on the back side of the semiconductor substrate 20. The hydrogen containing layer 22 and the outgassing prevention layer 23 may be formed by a plasma enhanced chemical vapor deposition (PE-CVD) process, for example.

Figure 2D:
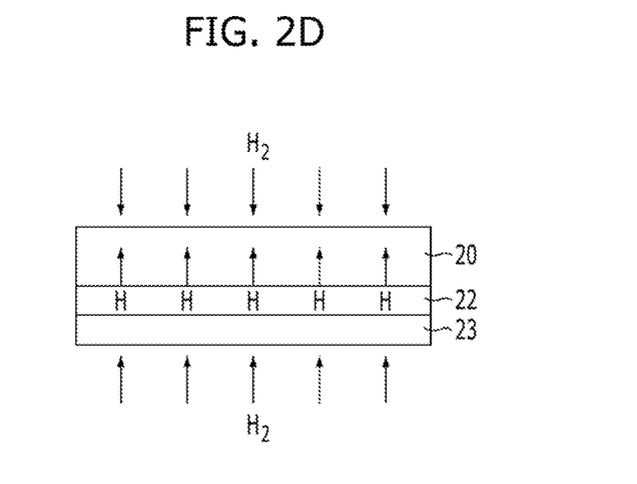

Referring to FIG. 2D, hydrogen treatment is performed under a hydrogen atmosphere. The hydrogen treatment may include an annealing process such as a $D_2/N_2$ annealing process or a high pressure $H_2/N_2$ annealing process, and an $H_2$ ion implantation process through the back side of the semiconductor substrate 20.

Since the one or more passivation layers 21 formed on the back side of the semiconductor substrate 20 are removed, and the hydrogen containing layer 22 and the outgassing prevention layer 23 have been formed, when the hydrogen treatment is performed, the hydrogen contained in the hydrogen containing layer 22 is not out-diffused, but diffused toward the semiconductor substrate 20 by the outgassing prevention layer 23. Therefore, the hydrogen treatment method, in accordance with the second embodiment of the present invention, uniformly diffuses hydrogen across the entire of the semiconductor substrate.

That is, regardless of whether or not the nitride layer exists over the semiconductor substrate 20, hydrogen may be uniformly diffused across the entire surface of the wafer. Therefore, a dangling bond of silicon may be eliminated, thereby reducing an interface state. Therefore, a refresh time may be secured to improve a refresh margin of a cell transistor. Furthermore, the hydrogen containing layer 22 and the outgassing prevention layer 23 prevent the semiconductor substrate 20 from being bent by the annealing process.

Figure 3A:
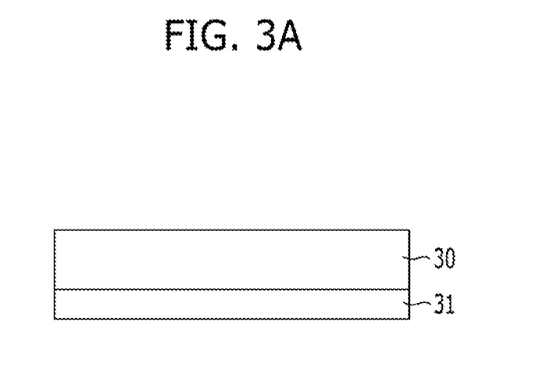
FIGS. 3A and 3B are cross-sectional views illustrating a hydrogen treatment method in accordance with a third embodiment of the present invention.
Figure 3B:
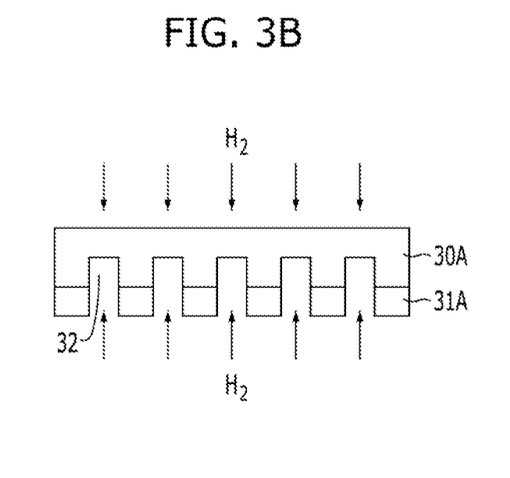

FIGS. 3A and 3B are cross-sectional views illustrating a hydrogen treatment method in accordance with a third embodiment of the present invention.

Referring to FIG. 3A, devices (not shown) are formed on a front side of a semiconductor substrate 30, and a front passivation layer (not shown) is deposited at the uppermost layer thereof. Furthermore, one or more passivation layers 31, including a nitride layer, are formed on a back side of a semiconductor substrate 30. Accordingly, it becomes difficult to diffuse hydrogen through the back side of the semiconductor substrate 30 during hydrogen treatment.

Therefore, referring to FIG. 3B, the one or more passivation layers 31 and the back side of the semiconductor substrate 30 are partially etched to form vias 32. The etched semiconductor substrate 30 is represented by reference numeral "30A", and the patterned passivation layers 31 are represented by reference numeral "31A," At this time, a depth of each of the vias 32 may be adjusted so that hydrogen may permeate into and diffuse through the substrate without having a negative effect on the devices. Furthermore, the depths of the vias 32 may be adjusted to avoid defects caused by gettering. For example, each of the vias 32 may be formed to a depth of at least about 1 μm. Furthermore, the number and positions of the vias 32 may be controlled according to the size of the semiconductor substrate.

Then, hydrogen treatment is performed. The hydrogen treatment may include an annealing process such as a $D_2/N_2$ annealing process or a high pressure $H_2/N_2$ annealing process, and an $H_2$ ion implantation process through the back side of the etched semiconductor substrate 30A, which are performed for passivation. At this time, the temperature and time of the hydrogen treatment may be controlled within such a range as to have no effect on a logic transistor of the devices.

After the semiconductor substrate 30 and the passivation layer 31 are etched to form the vias 32, the hydrogen treatment process may be performed under a hydrogen atmosphere. The permeation and diffusion of hydrogen, caused by the hydrogen treatment process, may be more easily performed because the hydrogen is directly contacted with a wide area and close to the top surface of the etched semiconductor substrate 30A.

Therefore, even though the one or more passivation layers 31, including the nitride layer, are still disposed over the etched semiconductor substrate 30A, hydrogen may be uniformly diffused across an entire surface of the etched semiconductor substrate 30A. Therefore, a dangling bond of silicon may be eliminated thereby reducing an interface state. Therefore, a refresh time may be secured to improve a refresh margin of a cell transistor.

FIGS. 4A to 4D are cross-sectional views illustrating a hydrogen treatment method in accordance with a fourth embodiment of the present invention.

Figure 4A:
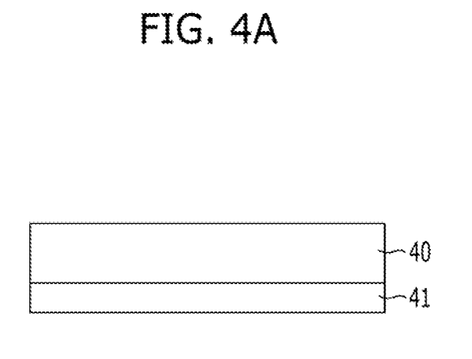
FIGS. 4A to 4D are cross-sectional views illustrating a hydrogen treatment method in accordance with a fourth embodiment of the present invention.

Referring to FIG. 4A, devices (not shown) are formed on a front side of a semiconductor substrate 40, and a front passivation layer (not shown) is deposited at the uppermost layer thereof. Furthermore, one or more passivation layers 41, including a nitride layer, are formed on the back side of the semiconductor substrate 40. Accordingly, it becomes difficult to diffuse hydrogen through the back side of the semiconductor substrate 40 during hydrogen treatment.

Figure 4B:
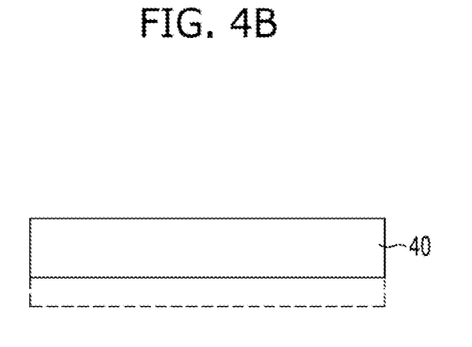

Therefore, referring to FIG. 4B, the one or more passivation layers 41, including the nitride layer formed on the back side of the semiconductor substrate 40 are removed. At this time, a process for partially reducing the thickness of the semiconductor substrate 40 may additionally be performed. The semiconductor substrate 40 may be etched through a wet etching or polishing process. During the etching process, the thickness of the semiconductor substrate 40 may be reduced until the thickness of semiconductor substrate 40 is greater than a thickness at which the semiconductor substrate will bend.

Figure 4C:
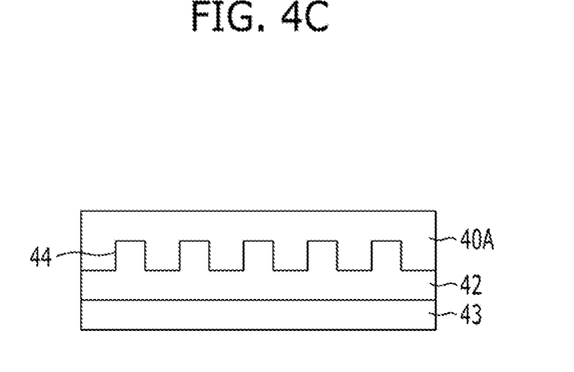

Referring to FIG. 4C, the back side of the semiconductor substrate 40 is partially etched to form vias 44. The etched semiconductor substrate 40 is represented by reference numeral "40A." At this time, a depth of each of the vias 44 may be adjusted so that hydrogen may permeate into and diffuse through the substrate without having a negative effect on the devices, Furthermore, the depths of the vias 44 may be adjusted to avoid defects caused by gettering. Furthermore, the number and positions of the vias 44 may be controlled based on the size of the semiconductor substrate.

Then, a hydrogen containing layer 42 is formed on the entire surface of the backside of the semiconductor substrate 40 so as to fill the vias 44. The hydrogen containing layer 42 may include an oxide layer containing a large amount of hydrogen. For example, the hydrogen containing layer 42 may include a high density plasma (HDP) oxide layer or a tetraethyl orthosilicate (TEOS) layer.

Subsequently, an outgassing prevention layer 43 may be formed. The outgassing prevention layer 43 may prevent hydrogen from being diffused from the hydrogen containing layer 42, and away from the etched semiconductor substrate 40A, during a subsequent annealing process. The outgassing prevention layer 43 may be formed of the same material as the one or more passivation layers 41. The outgassing prevention layer 43 may include a nitride layer. For example, the nitride layer may include a plasma-enhanced (PE) nitride layer.

At this time, the hydrogen containing layer 42 and the outgassing prevention layer 43 are formed on the backside of the etched semiconductor substrate 40A. The hydrogen containing layer 42 and the outgassing prevention layer 43 may be formed by PE-CVD, for example.

Figure 4D:
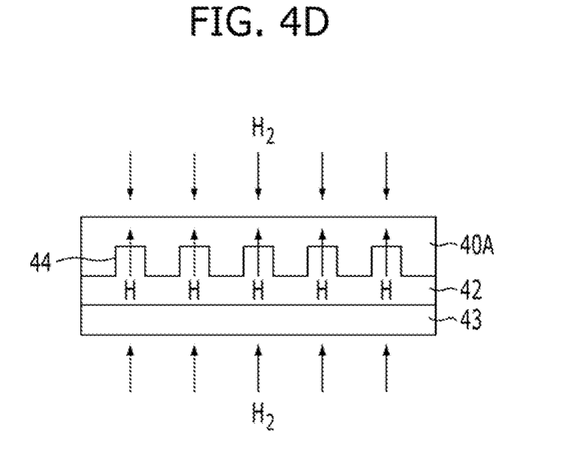

Referring to FIG. 4D, hydrogen treatment process is performed under a hydrogen atmosphere. The hydrogen treatment may include an annealing process such as a $D_2/N_2$ annealing or a high pressure $H_2/N_2$ annealing, and an $H_2$ ion implantation process through the back side of the semiconductor substrate 40. At this time, the temperature and time of the hydrogen treatment may be controlled within such a range as to have no effect on a logic transistor of the devices.

Since the one or more passivation layers 41, formed on the back side of the semiconductor substrate 40 are removed, the vias 44 are formed, and the hydrogen containing layer 42 and the outgassing prevention layer 43 are formed, when the hydrogen treatment is performed, the hydrogen contained in the hydrogen containing layer 42 is not out-diffused by the outgassing prevention layer 43, but diffused toward the semiconductor substrate 40 by the outgassing prevention layer 43. Therefore, the hydrogen treatment method in accordance with the fourth embodiment of the present invention uniformly diffuses hydrogen across the entire surface of the etched semiconductor substrate 40A.

That is, regardless of whether or not the nitride layer exists over the etched semiconductor substrate 40, hydrogen may be uniformly diffused across the entire surface of the wafer. Therefore, a dangling bond of silicon may be eliminated, thereby reducing an interface state. Therefore, a refresh time may be secured to improve a refresh margin of a cell transistor.

In accordance with the embodiments of the present invention, hydrogen is diffused through the back side of the wafer (semiconductor substrate) such that the hydrogen treatment process may be smoothly performed regardless of positions. Therefore, the refresh time may be secured to improve the refresh margin of the cell transistor.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming devices on a front side of a semiconductor substrate;
    forming a hydrogen-containing layer on a back side of the semiconductor substrate;
    forming an outgassing prevention layer over the hydrogen-containing layer; and
    diffusing hydrogen contained in the hydrogen-containing layer into the semiconductor substrate.

2. The method of claim 1, further comprising:
    forming one or more passivation layers on the front side and the back side of the semiconductor substrate after the forming of the devices; and
    exposing the back side of the semiconductor substrate.

3. The method of claim 1, wherein the diffusing of the hydrogen is performed under a hydrogen atmosphere.

4. The method of claim 1, wherein the outgassing prevention layer comprises a nitride layer.

5. The method of claim 4, wherein the nitride layer comprises a plasma-enhanced (PE) nitride layer.

6. The method of claim 1, wherein the hydrogen-containing layer comprises an oxide layer containing hydrogen.

7. The method of claim 1, wherein the hydrogen-containing layer comprises a high density plasma (HDP) oxide layer or a tetraethyl orthosilicate (TEOS) layer.

8. The method of claim 1, wherein the diffusing of hydrogen is performed by a deuterium/nitrogen ($D_2/N_2$) annealing process, high pressure hydrogen/nitrogen ($H_2/N_2$) annealing process, or an $H_2$ ion implantation process through the back side of the semiconductor substrate.

9. A method for fabricating a semiconductor device, comprising:
    forming devices on a front side of the semiconductor substrate;
    forming one or more passivation layers on the front side and the back side of the semiconductor substrate after the forming of the devices;
    forming vias by simultaneously and selectively etching a back side of the semiconductor substrate and the passivation layer formed on the back side of the semiconductor substrate; and
    performing a hydrogen treatment process on the semiconductor substrate through the vias to diffuse hydrogen into the semiconductor substrate.

10. The method of claim 9, wherein the hydrogen treatment process is performed by a deuterium/nitrogen ($D_2/N_2$) annealing process, high pressure hydrogen/nitrogen ($H_2/N_2$) annealing process, or an $H_2$ ion implantation process through the back side of the semiconductor substrate.

11. A method for fabricating a semiconductor device, the method comprising:
    forming devices on a front side of the semiconductor substrate;
    forming vias by selectively etching a back side of the semiconductor substrate;
    forming a hydrogen-containing layer to fill the vias;
    forming an outgassing prevention layer over the hydrogen-containing layer; and
    diffusing hydrogen contained in the hydrogen-containing layer into the semiconductor substrate.

12. The method of claim 11, further comprising:
    forming one or more passivation layers on the front side and the back side of the semiconductor substrate after the forming of the devices; and
    exposing the back side of the semiconductor substrate.

13. The method of claim 11, wherein the diffusing of hydrogen is performed under a hydrogen atmosphere.

14. The method of claim 11, wherein the outgassing prevention layer comprises nitride layer.

15. The method of claim 14, wherein the nitride layer comprises a plasma-enhanced (PE) nitride layer.

16. The method of claim 11, wherein the hydrogen-containing layer comprises an oxide layer containing hydrogen.

17. The method of claim 11, wherein the hydrogen-containing layer comprises a high density plasma (HDP) oxide layer or a tetraethyl orthosilicate (TEOS) layer.

18. The method of claim 11, wherein the diffusing of hydrogen is performed by a deuterium/nitrogen ($D_2/N_2$) annealing process, high pressure hydrogen/nitrogen ($H_2/N_2$) annealing process, or an $H_2$ ion implantation process through the back side of the semiconductor substrate.

19. The method of claim 11, further comprising:
    directing hydrogen generated by diffusing of hydrogen process to the semiconductor substrate using the outgassing prevention layer.

* * * * *